(12) United States Patent
Inaba et al.

(10) Patent No.: US 10,411,071 B2
(45) Date of Patent: Sep. 10, 2019

(54) SEMICONDUCTOR STORAGE DEVICE

(71) Applicant: TOSHIBA MEMORY CORPORATION, Tokyo (JP)

(72) Inventors: Tsuneo Inaba, Kamakura Kanagawa (JP); Hiroyuki Takenaka, Kamakura Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/109,363

(22) Filed: Aug. 22, 2018

(65) Prior Publication Data
US 2019/0103440 A1 Apr. 4, 2019

(30) Foreign Application Priority Data
Oct. 2, 2017 (JP) .................. 2017-192651

(51) Int. Cl.
*H01L 27/24* (2006.01)
*G11C 5/06* (2006.01)
*G11C 5/02* (2006.01)
*G11C 13/00* (2006.01)

(52) U.S. Cl.
CPC .......... *H01L 27/2454* (2013.01); *G11C 5/025* (2013.01); *G11C 5/063* (2013.01); *G11C 13/0002* (2013.01); *H01L 27/2481* (2013.01)

(58) Field of Classification Search
CPC .................. H01L 27/2454; H01L 27/2481
See application file for complete search history.

(56) References Cited

U.S. PATENT DOCUMENTS

| 9,685,484 | B1* | 6/2017 | Rabkin | H01L 27/2481 |
| 9,825,100 | B2* | 11/2017 | Sekino | H01L 27/249 |
| 2016/0020389 | A1* | 1/2016 | Ratnam | G11C 13/004 257/2 |
| 2016/0071583 | A1 | 3/2016 | Murooka | |
| 2019/0088316 | A1* | 3/2019 | Inuzuka | G11C 13/003 |

* cited by examiner

*Primary Examiner* — Allison Bernstein
(74) *Attorney, Agent, or Firm* — Kim & Stewart LLP

(57) ABSTRACT

A semiconductor storage device includes a global bit line extending in a horizontal direction, a select transistor provided on the global bit line and including a first terminal connected to the global bit line, a bit line provided on the select transistor, extending in a vertical direction, and connected to a second terminal of the select transistor, a plurality of word lines and insulating layers that are stacked alternately in a vertical direction, a first variable resistance layer between one of the plurality of word lines and a first side surface of the bit line, a plurality of dummy word lines and insulating layers that are stacked alternately in the vertical direction and disposed at the same level as the plurality of word lines, and a second variable resistance layer between the plurality of dummy word lines and a second side surface of the bit line.

20 Claims, 15 Drawing Sheets

FIG. 16

|  | RESET | SET | READ |
|---|---|---|---|
| SG_s | Vg_w | Vg_e | Vg_r |
| SG_u | 0 | 0 | 0 |
| GBL_s | Vw | 0 | Vr |
| GBL_u | Vwf | Vef | Vr |
| WL_s | 0 | Ve | 0 |
| WL_u | Vwf | Vef | Vr |
| DWL_s | Vwf | Vef | Vr |

SEMICONDUCTOR STORAGE DEVICE

CROSS-REFERENCE TO RELATED APPLICATIONS

This application is based upon and claims the benefit of priority from Japanese Patent Application No. 2017-192651, filed Oct. 2, 2017, the entire contents of which are incorporated herein by reference.

FIELD

Embodiments described herein relate generally to a semiconductor storage device.

BACKGROUND

As one type of a semiconductor memory device, a resistance-change type memory, for example, a Resistive Random Access Memory (ReRAM) is known. A memory cell of the ReRAM includes a variable resistance layer of which a resistance is changed by an application of a voltage. High integration and low cost are expected by stacking the memory cells of the ReRAM to form a three-dimensional structure.

DESCRIPTION OF THE DRAWINGS

FIG. 16 is a diagram for describing voltages of the reset operation, the set operation, and the read operation.

DETAILED DESCRIPTION

Figure 1:
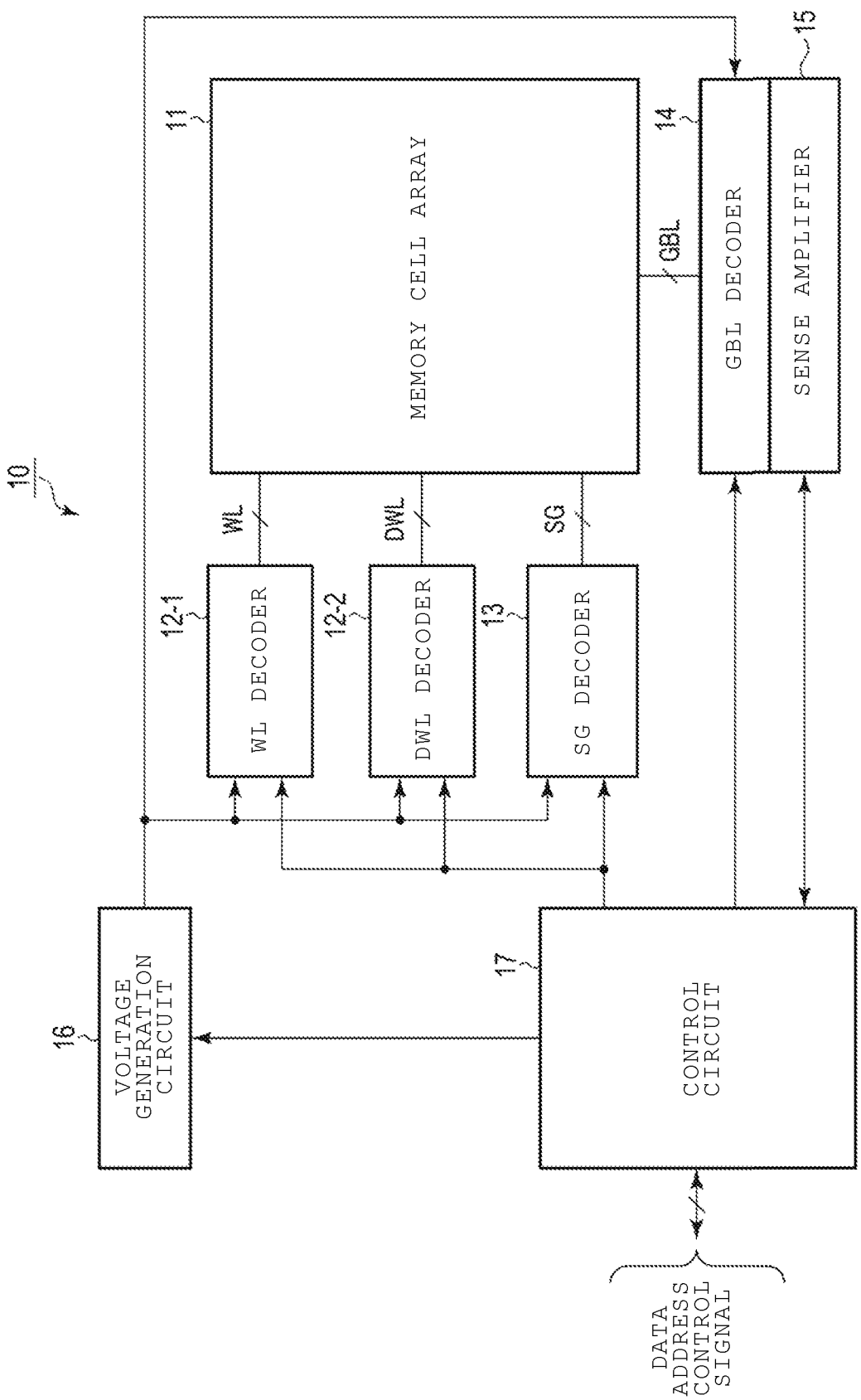
FIG. 1 is a block diagram of a semiconductor storage device according to an embodiment.

Embodiments provide a semiconductor storage device capable of reduced chip area by reducing an arrangement region of a so-called dummy word line.

In general, according to an embodiment, a semiconductor storage device includes a global bit line that extends in a first horizontal direction, a first select transistor provided on the global bit line and including a first terminal connected to the global bit line, a first bit line provided on the first select transistor, extending in a vertical direction, and connected to a second terminal of the first select transistor, a plurality of word lines and insulating layers that are stacked in a vertical direction, a first variable resistance layer between one of the plurality of word lines and a first side surface of the first bit line, a plurality of first dummy word lines and insulating layers that are that are stacked alternately in the vertical direction and disposed at the same level as the plurality of word lines, and a second variable resistance layer between one of the plurality of first dummy word lines and a second side surface opposite to the first side surface of the first bit line.

According to another embodiment, a semiconductor storage device includes a global bit line that extends in a first horizontal direction, a first select transistor provided on the global bit line and including a first terminal connected to the global bit line, a first bit line provided on the first select transistor, extending in a vertical direction, and connected to a second terminal of the first select transistor, a plurality of word lines and insulating layers that are stacked alternately in a vertical direction, a first variable resistance layer between one of the plurality of word lines and a first side surface of the first bit line, a plurality of first dummy word lines and insulating layers that are stacked alternately in the vertical direction and disposed at the same level as the plurality of word lines, and a second variable resistance layer between one of the plurality of first dummy word lines and a second side surface opposite to the first side surface of the first bit line, wherein one of the plurality of dummy word lines is electrically connected to a ground voltage.

Embodiments will be described with reference to the accompanying drawings. In addition, in the following description, the same reference numerals are given to elements having the same functions and configurations, and a repetitive explanation will be made only when necessary. The drawings are schematic and conceptual, and the dimensions and ratios of the drawings are not limited to the same as those of the reality. The embodiments merely exemplify devices and methods for embodying the technical spirit of the embodiments, and the technical spirit does not limit the materials, shapes, structures, arrangement, and the like of the components to those to be described below.

Hereinafter, as a semiconductor storage device, a resistance-change type memory using a variable resistance element of which a resistance value changes by an application of a voltage or a flow of a current will be described. The resistance-change type memory is also referred to as a Resistive Random Access Memory (ReRAM).

[1] Configuration of Semiconductor Storage Device

FIG. 1 is a block diagram of a semiconductor storage device 10 according to an embodiment. The semiconductor storage device 10 includes a memory cell array 11, a WL decoder 12-1, a DWL decoder 12-2, an SG decoder 13, a GBL decoder 14, a sense amplifier 15, a voltage generation circuit 16, and a control circuit 17.

The memory cell array 11 includes a plurality of variable resistance elements as storage elements. A variable resistance element is connected to a bit line BL and a word line WL. In addition, the memory cell array 11 includes a plurality of select transistors corresponding to a plurality of bit lines BL. A bit line is connected to a global bit line GBL through the select transistor. A select gate line SG is connected to a gate of the select transistor. A specific configuration of the memory cell array 11 will be described later.

The WL decoder 12-1 is connected to a plurality of word lines WL. The WL decoder 12-1 includes a word line selection circuit and a word line driver. The WL decoder 12-1 receives a row address from the control circuit 17 and selects one word line using the row address. The WL decoder 12-1 applies a voltage required for data resetting, reading, and setting to a selected word line and a non-selected word line.

The DWL decoder 12-2 is connected to a plurality of dummy word lines DWL. The DWL decoder 12-2 includes a dummy word line selection circuit and a dummy word line driver. The DWL decoder 12-2 applies a predetermined voltage to the dummy word line DWL.

The SG decoder 13 is connected to a plurality of select gate lines SG. The SG decoder 13 includes a select gate line selection circuit and a select gate line driver. The SG decoder 13 receives a sheet address from the control circuit 17 and selects one select gate line SG_using the sheet address.

The GBL decoder 14 is connected to a plurality of global bit lines GBL. The GBL decoder 14 includes a global bit line selection circuit and a global bit line driver. The GBL decoder 14 receives a column address from the control circuit 17 and selects one global bit line GBL using the column address. The GBL decoder 14 applies a voltage required for the data resetting, reading, and setting to a selected global bit GBL and a non-selected global bit line GBL.

The sense amplifier 15 detects and amplifies data read from the variable resistance element to the global bit line GBL, in a read operation. The data read by the sense amplifier 15 is transmitted to the control circuit 17.

The voltage generation circuit 16 generates a plurality of voltages required for data writing, reading, and erasing. The voltages generated by the voltage generation circuit 16 are supplied to the WL decoder 12-1, the DWL decoder 12-2, the SG decoder 13, and the GBL decoder 14.

The control circuit 17 comprehensively controls the operation of the semiconductor storage device 10. The control circuit 17 is connected to a memory controller (a host device) through a bus. The control circuit 17 receives data, an address, a control signal, and the like from the host device. The control circuit 17 executes a write operation, a read operation, and an erase operation using the data, the address, and the control signal.

[1-1] Configuration of Memory cell array 11

Figure 2:
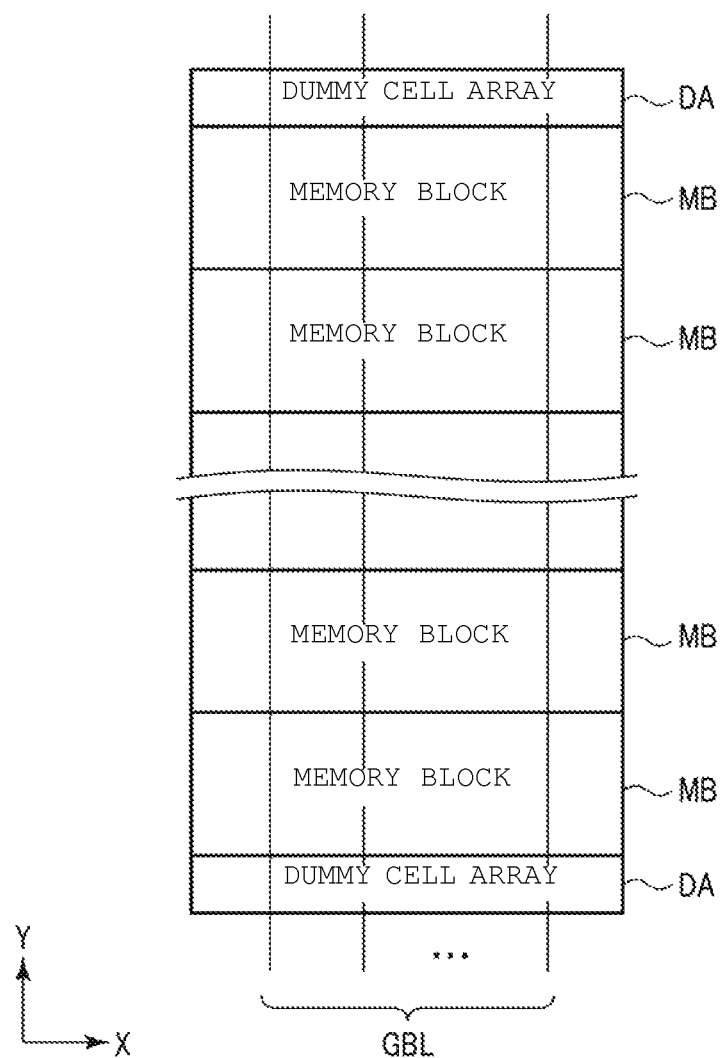
FIG. 2 is a block diagram of a memory cell array.

Next, the configuration of the memory cell array 11 illustrated in FIG. 1 will be described. FIG. 2 is a block diagram of the memory cell array 11. An X-direction and a Y-direction shown in FIG. 2 are orthogonal to each other in a horizontal plane.

The memory cell array 11 includes a plurality of memory blocks MB and two dummy cell arrays DA. Each of the plurality of memory blocks MB includes a plurality of memory cells. Each of the plurality of dummy cell arrays DA includes a plurality of dummy cells. A memory cell stores data in a nonvolatile manner. A dummy cell has the same structure as a memory cell.

The two dummy cell arrays DA are disposed on both sides in the Y-direction of the plurality of memory blocks MB. The plurality of global bit lines GBL is commonly connected to the plurality of memory blocks MB and the plurality of dummy cell arrays DA.

Figure 3:
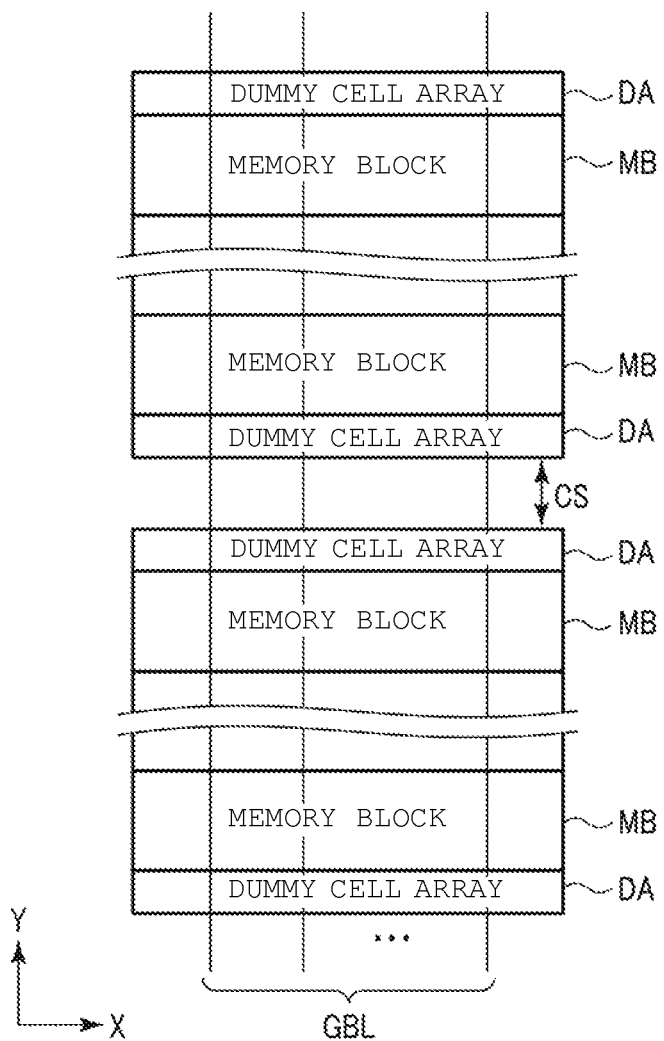
FIG. 3 is a block diagram illustrating another configuration example of the memory cell array.

FIG. 3 is a block diagram illustrating another configuration example of the memory cell array 11. A plurality of units (the configuration illustrated in FIG. 2) including the plurality of memory blocks MB and the two dummy cell arrays DA may be arranged in the Y-direction. Two adjacent units are disposed with a space CS between the two adjacent units. For example, in the space CS, a contact or the like that connects a circuit of a cell lower layer with a wiring of a cell upper layer is disposed.

[1-2]Configuration of Memory Block MB

Figure 4:
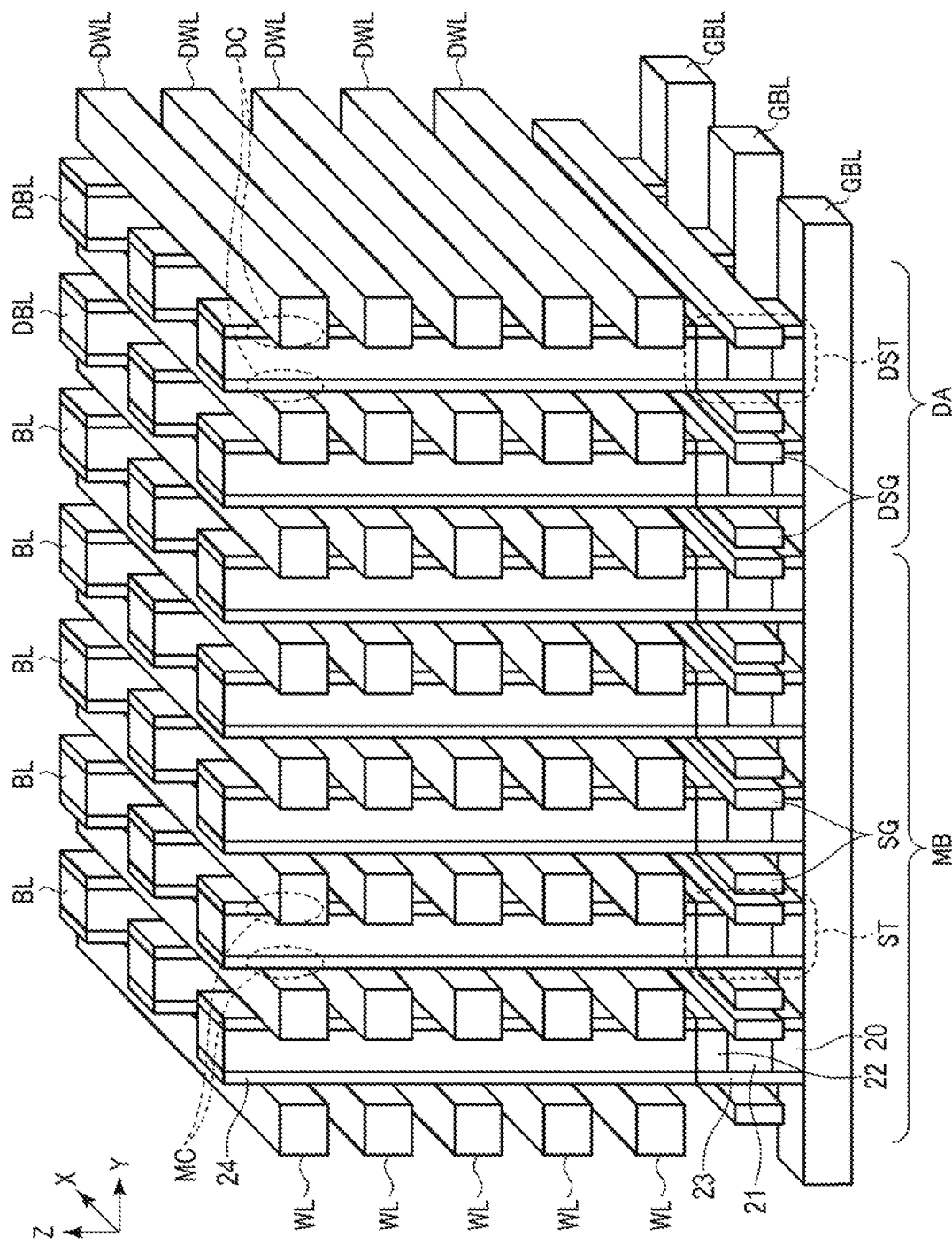
FIG. 4 is a perspective view of a memory block and a dummy cell array.
Figure 5:
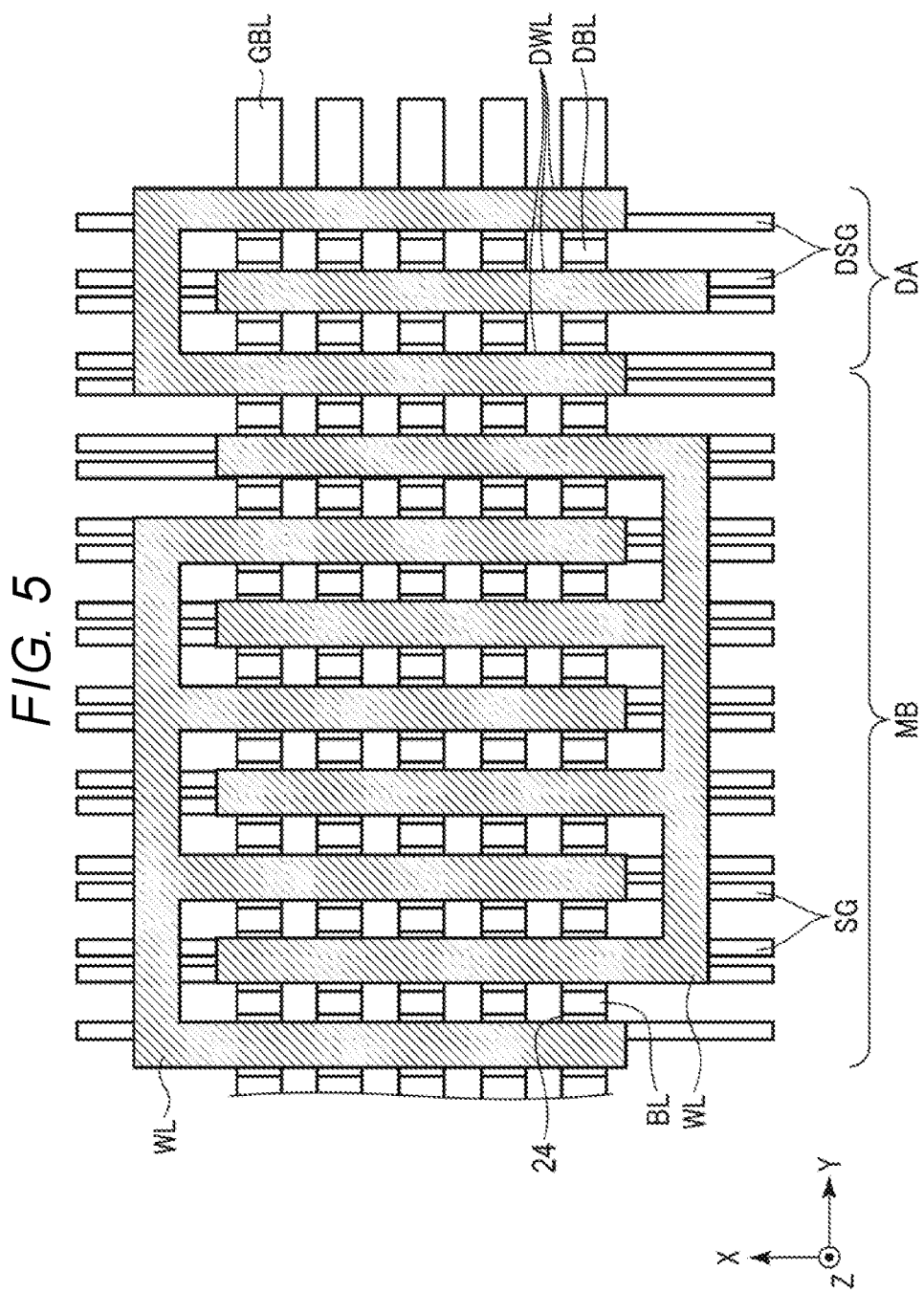
FIG. 5 is a plan view of a memory block and a dummy cell array.

Next, the configuration of the memory block MB will be described. FIG. 4 is a perspective view of the memory block MB and the dummy cell array DA. A Z-direction shown in FIG. 4 is a vertical direction. FIG. 5 is a plan view of the memory block MB and the dummy cell array DA. FIG. 5 shows a region to which a diagonal line denotes a layout of the word line WL. In addition, in FIGS. 4 and 5, the configuration of the dummy cell array DA is also shown, and the configuration of the dummy cell array DA will be described later.

A layer of the plurality of global bit lines GBL extending in the Y-direction and arranged along the X-direction is provided on a substrate (not shown). A layer of the plurality of select gate lines SG extending in the X-direction and arranged along the Y-direction is provided on the plurality of global bit lines GBL. A layer of the plurality of word lines extending in the X-direction and arranged along the Y-direction is provided on the plurality of select gate lines SG. A plurality of the layers of the plurality of word lines is further stacked. A plurality of insulating layers is provided between the plurality of stacked wiring layers, respectively.

The plurality of bit lines extending in the Z-direction is provided between the word lines that are adjacent in the Y-direction. A plurality of insulating layers is provided between the plurality of bit lines BL, respectively. A bit line BL is connected to a global bit line GBL through a select transistor ST.

A variable resistance layer 24 is provided between a word line WL and a bit line BL. The variable resistance layer 24 functions as a part of a memory cell MC that stores data in an intersection of the word line WL and the bit line BL. As illustrated in FIG. 5, the plurality of word lines WL in the wiring layer of the same level is commonly connected to each word line. In other words, the memory cell array 11 includes two word lines WL of a comb shape structure, and a plurality of word line portions (straight line portions of the comb shape structure) extending in the X-direction alternately belongs to two comb shape structure.

Specifically, among the plurality of word lines WL sequentially arranged from a left side of FIG. 5, a plurality of even-numbered word lines is commonly connected to each other and the same voltage is applied to the plurality of even-numbered word lines. In addition, a plurality of odd-numbered word lines is commonly connected to each other and the same voltage is applied to the plurality of odd-numbered word lines. The odd-numbered word line and the even-numbered word line are electrically separated from each other and different voltages may be applied to the odd-numbered word line and the even-numbered word line. Hereinafter, a set of even-numbered ($0^{th}$, $2^{nd}$, $4^{th}$, . . . ) word lines will be referred to as a word line group WLcomb_a and a set of odd-numbered ($1^{st}$, $3^{rd}$, $5^{th}$, . . . ) word lines will be referred to as a word line group WLcomb_b. In addition, in a case where both are not distinguished from each other, the both are simply referred to as a word line group WLcomb.

In addition, in FIG. 5, although eight word lines, five global bit lines GBL, and 45 bits lines BL are shown, these are merely examples, and the numbers of these may be selected as appropriate.

Figure 6:
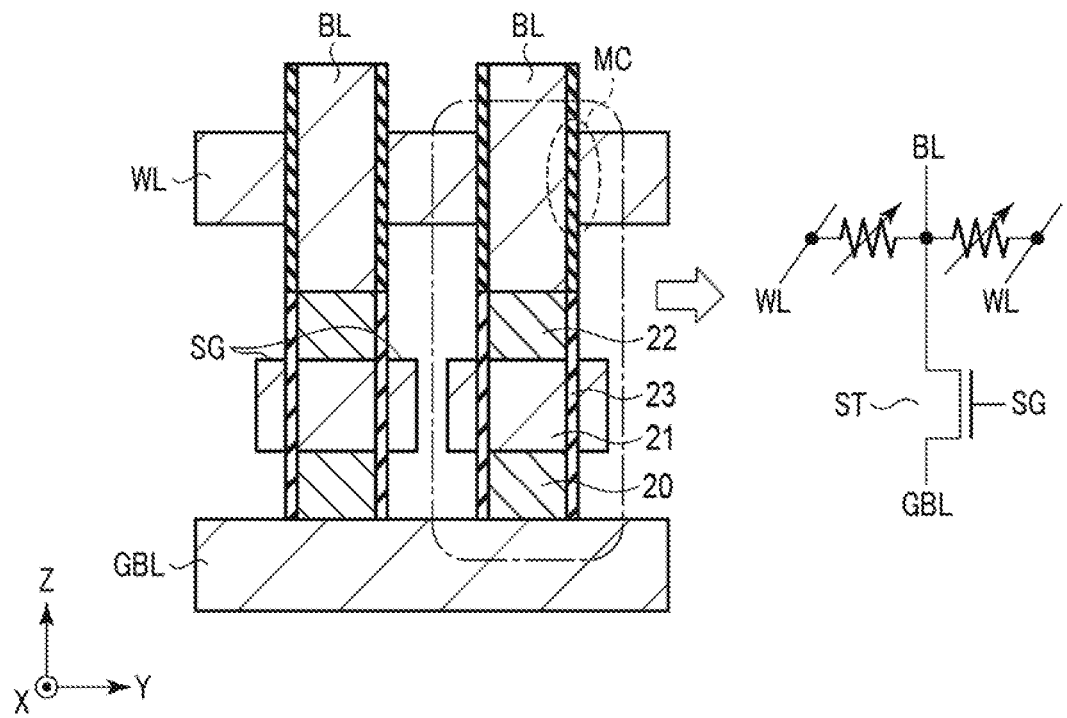
FIG. 6 is a cross-sectional view and an equivalent circuit diagram illustrating a memory cell and a select transistor by extracting the memory cell and the select transistor.

FIG. 6 is a cross-sectional view and an equivalent circuit diagram illustrating the memory cell MC and the select transistor ST by extracting the memory cell MC and the select transistor ST.

The select transistor ST is provided on the global bit line GBL. The select transistor ST includes a source region 20, a channel region 21, a drain region 22, a gate insulation film 23, and a select gate line (a gate electrode) SG. The select transistor ST is configured with a vertical Field Effect Transistor (FET) or the like, however, may be another type of element such as a vertical TFT as long as the select transistor ST is a switching element.

The source region 20, the channel region 21, and the drain region 22 are sequentially stacked. Each of the source region 20 and the drain region 22 are configured with an N$^+$-type semiconductor layer into which high concentration of N-type impurity is introduced. The channel region 21 is configured with a P-type semiconductor layer.

The gate insulation film 23 is provided on a side surface of the channel region 21. The select gate line SG is provided on a side surface of the gate insulation film 23. In addition, two select gate lines SG_sandwiching the channel region 21 from both sides in the Y-direction are electrically connected to each other and function as one select gate line.

The select transistor ST is also referred to as a sheet selector (a selection element). The "sheet" indicates a set of memory cells selected by one of the select gate lines SG. In FIG. 4, the set of the memory cells in a plane formed by the X-direction and the Z-direction is the sheet.

The bit line BL of a column shape is provided on the drain region 22. The variable resistance layer 24 is provided on a side surface of the bit line BL. In the present embodiment, the variable resistance layer 24 is provided on the entire surface of the bit line BL. The word line WL is provided in a region between adjacent bit lines BL in the Y-direction. A portion of the variable resistance layer 24 disposed between the bit line BL and the word line WL functions as the memory cell MC.

For example, polysilicon is used in the bit line BL and the select gate line SG. For example, a low resistance semiconductor or a metal material into which high concentration impurity is introduced is used in the word line WL and the global bit line GBL. For example, silicon oxide (SiO$_2$), silicon nitride (SiN), or the like is used in the gate insulation film 23.

For example, the variable resistance layer 24 includes hafnium oxide (HfO). The variable resistance layer 24 represented by HfO is a material that transits at least two resistance values of a low resistance state (LRS) and a high resistance state (HRS). For example, the variable resistance layer of the high resistance state transits to the low resistance state in a case where a voltage equal to or higher than a certain voltage is applied to the variable resistance layer, and the variable resistance layer of the low resistance state transits to the high resistance state in a case where a certain current or more flows through the variable resistance layer.

In particular, the transition from the high resistance state to the low resistance state and the transition from the low resistance state to the high resistance state by applying voltages of different polarities are called to a bipolar operation element. In addition to HfO, the variable resistance layer 24 that performs such an operation may be configured with a thin film containing TiO$_2$, ZnMn$_2$O$_4$, NiO, AlO, SrZrO$_3$, Pr$_{0.7}$Ca$_{0.3}$MnO$_3$, or the like.

In addition, Si, Ge, SiGe, GaAs, InP, GaP, GaInAsP, GaN, SiC, SiO, SiON, SiN, HfSiO, AlO or the like of polycrystalline or amorphous state maybe used in the variable resistance layer 24. In addition, a stacked film made of the above-described materials maybe used in the variable resistance layer 24. In addition, for example, an electrode of Ag, Au, Ti, Ni, Co, Al, Fe, Cr, Cu, W, Hf, Ta, Pt, Ru, Zr, or Ir, or nitride or carbide thereof may be disposed between the variable resistance layer 24 and the bit line BL. In addition, as the electrode, a material obtained by adding the above-described material to polycrystalline silicon may be used.

Therefore, the memory cells MC including the word line WL, the bit line BL, and the variable resistance layer 24 provided between the word line WL and the bit line BL are disposed in a three-dimensional matrix shape. In the present structure, the word line WL and the bit line BL are simple line and space patterns. The word line WL and the bit line BL may have a positional relationship in which the word line WL and the bit line BL intersect with each other, and it is not necessary to consider deviation in a word line direction and a bit line direction. Therefore, alignment accuracy in the memory cell at the time of manufacturing the memory cell may be very loose, thereby easily performing manufacturing. In addition, in this structure, information of one bit may be stored in a 2F$^2$ region, and high integration is possible.

Figure 7:
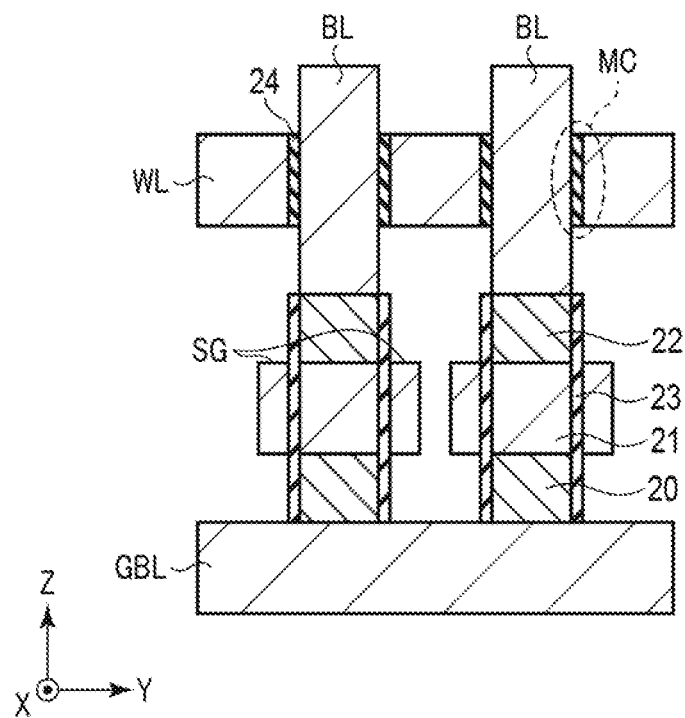
FIG. 7 is a cross-sectional view illustrating another configuration example of the memory cell.

In addition, the memory cell MC maybe formed only between the word line WL and the bit line BL. FIG. 7 is a cross-sectional view illustrating another configuration example of the memory cell MC. The variable resistance layer 24 is provided only between the word line WL and the bit line BL. That is, the variable resistance layer 24 is not connected between the memory cells MC that are adjacent to each other in a stack direction. The memory cell MC may be configured as shown in FIG. 7.

In addition, the gate insulation film 23 of the select transistor ST may be provided only between the channel region 21 and the gate electrode SG or may not necessarily be formed on side surface portions of the source region 20 and the drain region 22.

[1-3] Configuration of Dummy Cell Array DA

Next, the configuration of the dummy cell array will be described. As illustrated in FIGS. 4 and 5, the memory cell array 11 includes the dummy cell array DA. The three-dimensional structure of the dummy cell array DA is the same as the three-dimensional structure of the memory block MB.

The plurality of dummy word lines DWL is provided in the dummy cell array DA. The number of the stacked dummy word lines DWL is the same as the number of the stacked word lines WL.

The dummy word line DWL is required in a lithography process or etching process for forming the word line and is used for accurately forming a shape of the word line excluding the dummy word line.

FIGS. 4 and 5 show three dummy word lines DWL as the dummy word lines DWL in the wiring layer of the same level as an example. The number of the dummy word lines DWL in the wiring layer of the same level may be one or may be plural number other than three.

The bit line BL and the variable resistance layer 24 are provided between the word line WL disposed at an end portion of the Y-direction and the dummy word line DWL adjacent to the word line WL. In addition, the bit line BL and the variable resistance layer 24 are provided between the adjacent dummy word lines DWL. The portion of the variable resistance layer 24 disposed between the bit line BL and the dummy word line DWL functions as the dummy cell DC.

A bit line connected to only the dummy cell DC is denoted as DBL and a select gate line connected to only the dummy cell DC is denoted as DSG. A select transistor connected to the select gate line DSG is denoted as DST.

[1-4]Circuit Configuration of Memory Cell Array 11

Figure 8:
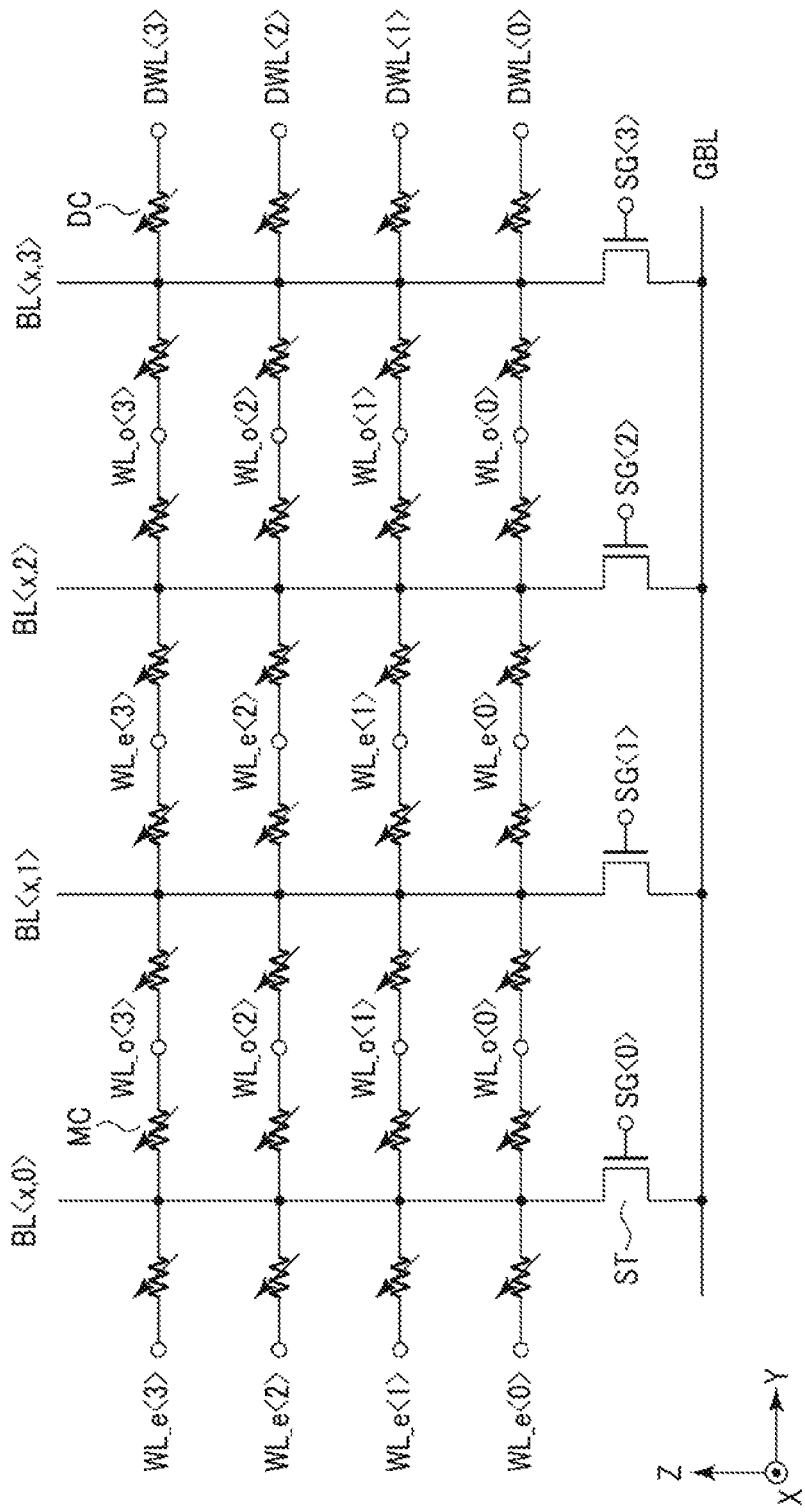
FIG. 8 is a circuit diagram of the memory cell array.

Next, the circuit diagram (an equivalent circuit diagram) of the memory cell array 11 will be described. FIG. 8 is a circuit diagram of the memory cell array 11. The even-numbered word lines are denoted as "WL_e" and the odd-numbered word lines are denoted as "WL_o". The even-numbered word lines WL_e and the odd-numbered word lines WL_o are alternately arranged along the Y-direction. An individual voltage control is possible for the word lines WL_e and the word lines WL_o. The memory cell MC is disposed in an intersecting region of the bit line BL and the word line WL and is connected to the bit line BL and the word line WL.

A drain of the select transistor ST is connected to the bit line BL, a source of the select transistor ST is connected to the global bit line GBL, and the gate of the select transistor ST is connected to the select gate line SG.

The dummy word line DWL is adjacent to the word line WL_o at an end portion of the memory block MB. The dummy cell DC is disposed in an intersecting region of the bit line BL and the dummy word line DWL and is connected to the bit line BL and the dummy word line DWL. In addition, FIG. 8 illustrates the stacked dummy word line DWL of one row by extracting the stacked dummy word line DWL of one row.

FIG. 8 illustrates the word lines of four layers and four bit lines by extracting the word lines of four layers and four bit lines. That is, FIG. 8 illustrates word lines WL_e<0> to WL_e<3>, the word line WL_o<0> to WL_o<3>, dummy word lines DWL<0> to DWL<3>, select gate lines SG<0> to SG<3>, and bit lines BL<x, 0>to BL<x, 3>. "x" means an arbitrary row of the Y-direction.

Figure 9:
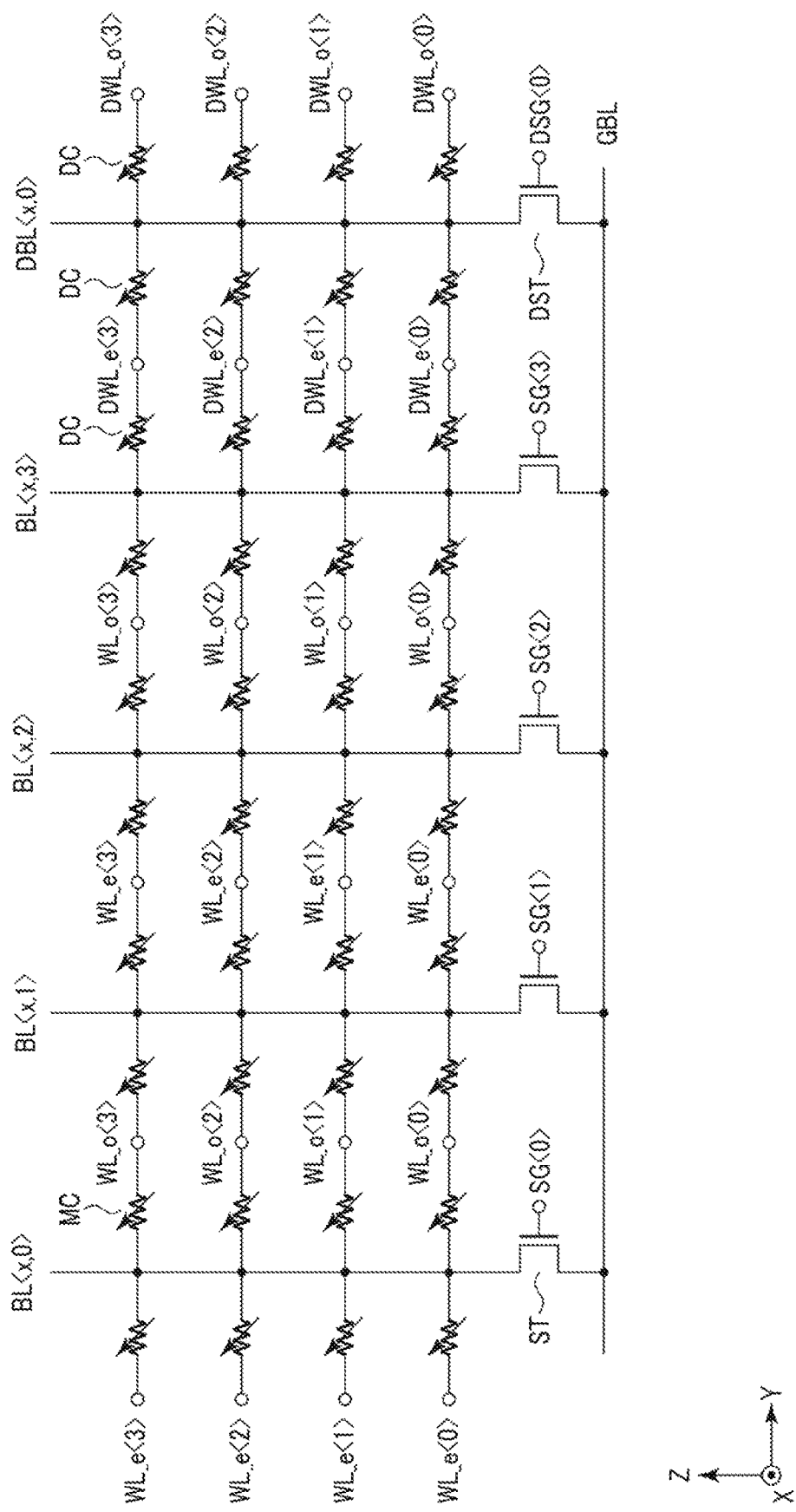
FIG. 9 is a circuit diagram illustrating another configuration example of the dummy cell array.

FIG. 9 is a circuit diagram illustrating another configuration example of the dummy cell array DA. Even-numbered dummy word lines are denoted as "DWL_e" and Odd-numbered dummy word lines are denoted as "DWL_o".

The plurality of dummy cells DC is connected between the dummy word lines DWL_e<0> to DWL_e<3> and a bit line DBL<x, 0>. In addition, the plurality of dummy cells DC is connected between the dummy word lines DWL_o<0> to DWL_o<3> and the bit line DBL<x, 0>. The bit line DBL<x, 0> is connected to the select transistor DST and the select transistor DST is connected to the select gate line DSG<0>.

[1-5]Configuration of Hookup Region

Next, the configuration of the hookup region will be described. The hookup region is a region for connecting the stacked word lines WL to a decoder or the like. The memory cell array 11 includes the hookup regions HU1 and HU2 in both end portions of word line WL in the X-direction.

Figure 10:
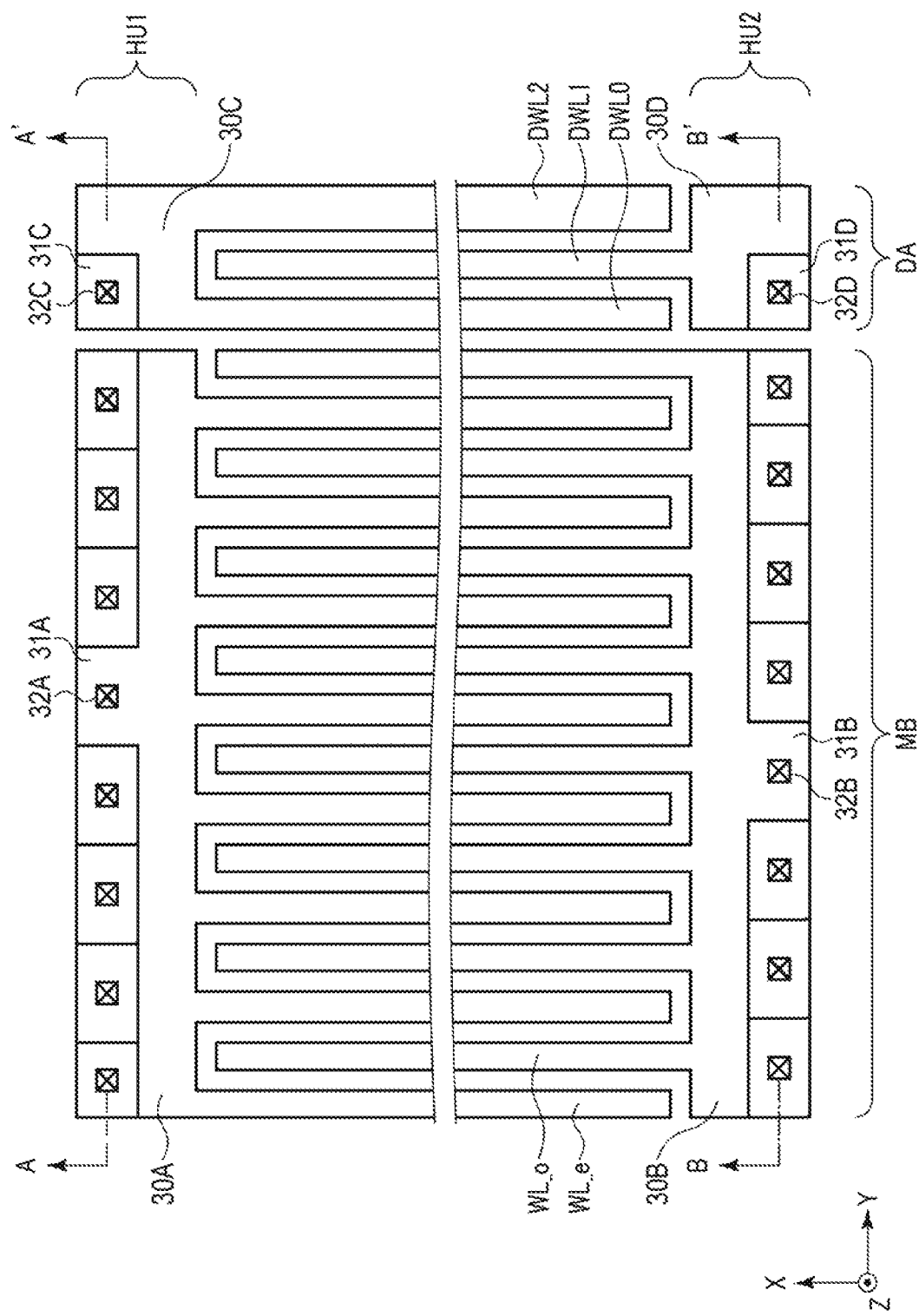
FIG. 10 is a plan view of hookup regions.
Figure 11:
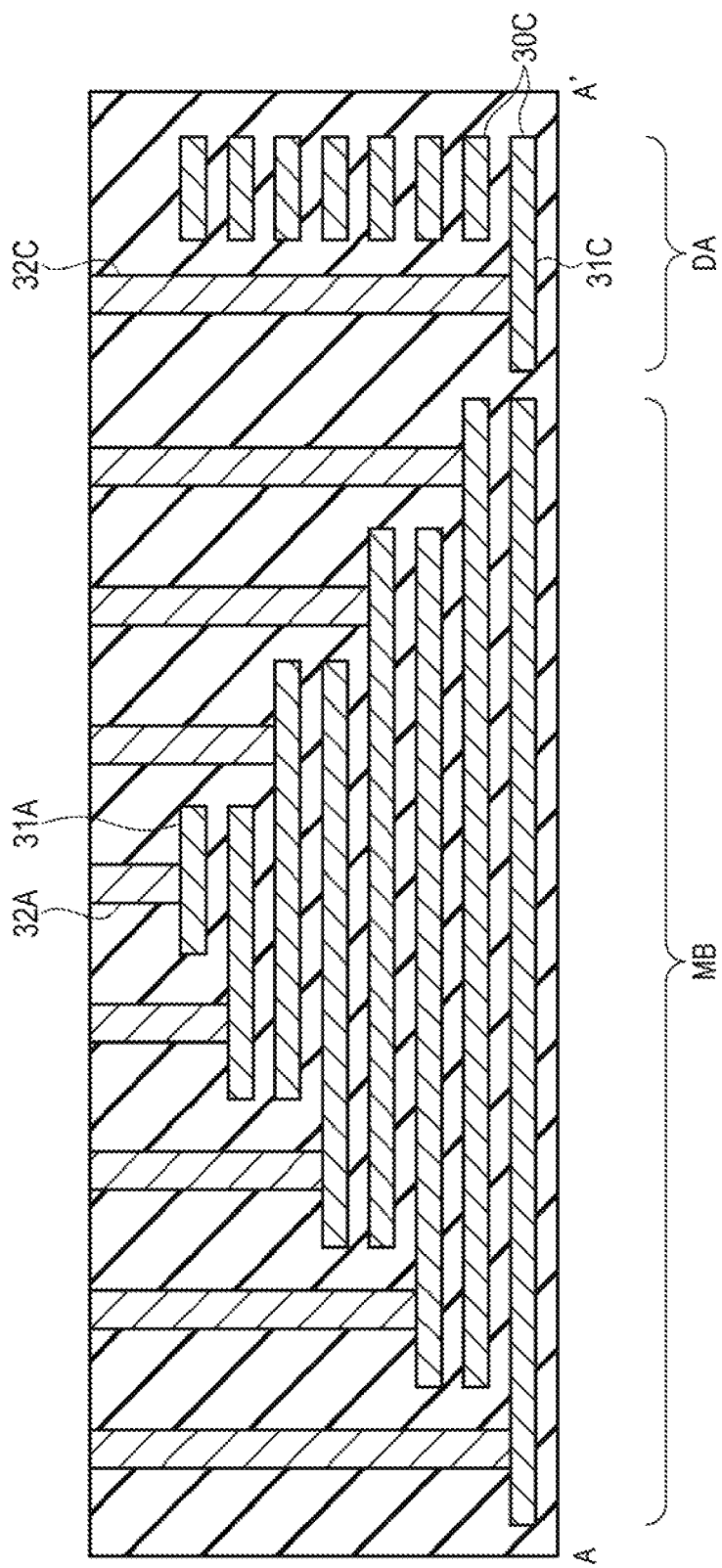
FIG. 11 is a cross-sectional view of the hookup region taken along a line A-A' of FIG. 10.
Figure 12:
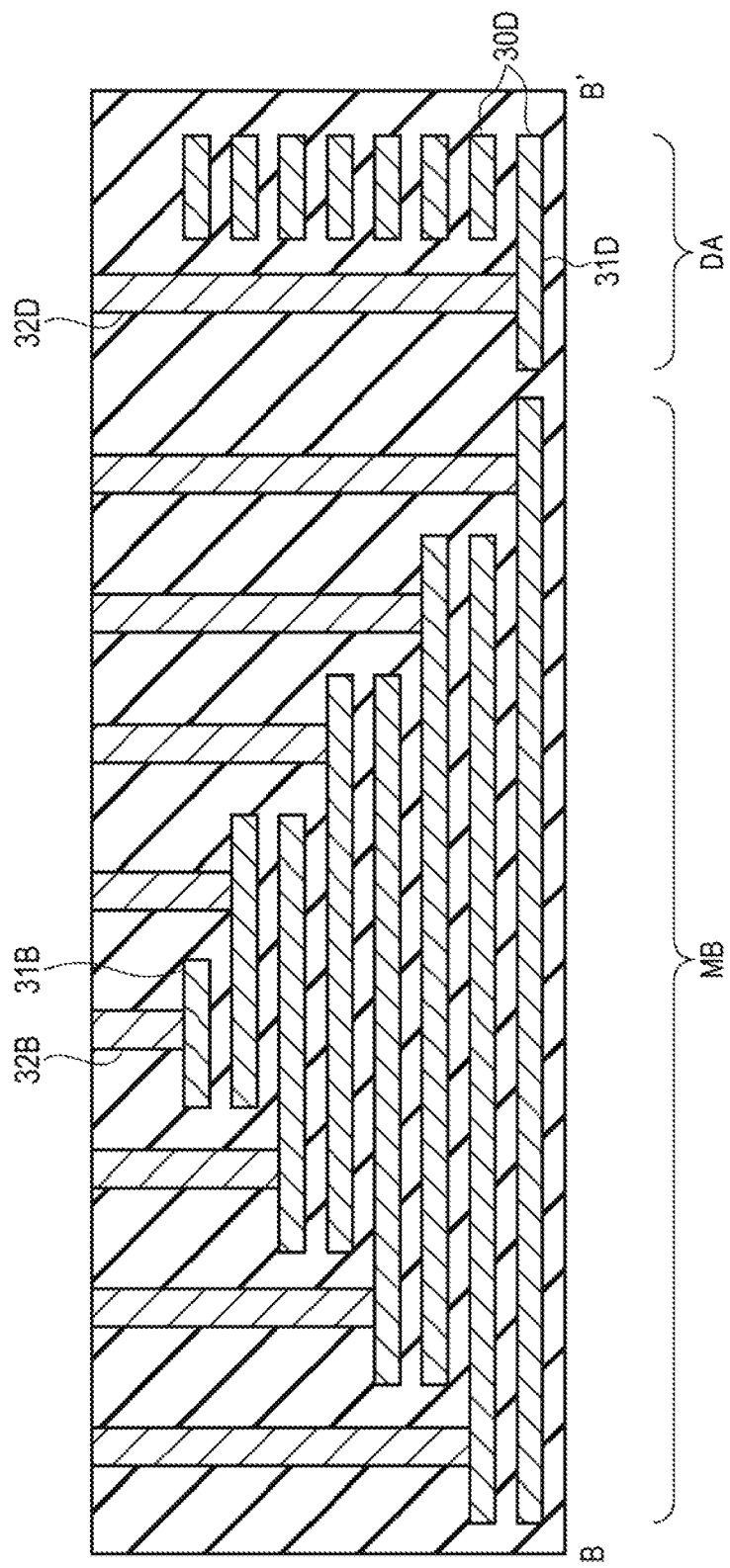
FIG. 12 is a cross-sectional view of the hookup region taken along a line B-B' of FIG. 10.

FIG. 10 is a plan view of the hookup regions HU1 and HU2. FIG. 11 is a cross-sectional view of the hookup region HU1 taken along a line A-A' of FIG. 10. FIG. 12 is a cross-sectional view of the hookup region HU2 taken along a line B-B' of FIG. 10. FIGS. 10 to 12 show the word line WL of eight layers and the dummy word lines of eight layers as an example.

In a wiring layer of the same level, the plurality of word lines WL_e is connected to a connection electrode 30A extending in the Y-direction. The connection electrode 30A is connected to an extraction electrode 31A extending in the X-direction. A contact plug 32A is provided on the extraction electrode 31A. A plurality of contact plugs 32A of the hookup region HU1 is alternately disposed on the right and left using the extraction electrode 31A of the uppermost layer as the center. The plurality of extraction electrodes 31A is formed in a step shape according to a layout of the contact plug 32A.

In a wiring layer of the same level, the plurality of word lines WL_o is connected to a connection electrode 30B extending in the Y-direction. The connection electrode 30B is connected to an extraction electrode 31B extending in the X-direction. A contact plug 32B is provided on the extraction electrode 31B. A plurality of contact plugs 32B of the hookup region HU2 is also alternately arranged on the right and left using the extraction electrode 31B of the uppermost layer as the center. The plurality of extraction electrodes 31B is formed in a step shape according to a layout of the contact plug 32B.

As described above, in the memory block MB, the plurality of stacked word line groups WLcomb of the comb shape is electrically connected to the plurality of contact plugs 32A (or the plurality of contact plugs 32B) and the individual voltage control is possible by the plurality of contact plugs 32A. In addition, it is possible to reduce the area of the hookup region HU1 where the plurality of contact plugs 32A is disposed, by forming the plurality of extraction electrodes 31A in the step shape. The same applies to the plurality of contact plugs 32B.

Next, a configuration of the hookup region in the dummy cell array DA will be described. For example, three dummy word lines DWL0 to DWL2 are provided in the wiring layer of the same level. The dummy word lines DWL0 to DWL2 are sequentially arranged from a side closer to the memory block MB.

In the wring layer of the same level, the dummy word line DWL0 and the dummy word line DLW2 are connected to a connection electrode 30C of an L shape. An extraction electrode 31C extending in the X-direction is connected to at least one layer of the connection electrode 30C among eight layers of the connection electrode 30C. In the present embodiment, for example, the extraction electrode 31C is extracted from the connection electrode 30C of the lowermost layer. A contact plug 32C is provided on the extraction electrode 31C. That is, voltage control is possible for only one layer among eight layers of the dummy word line DWL0 through the contact plug 32C. Similarly, voltage control is possible for only one layer among eight layers of the dummy word line DWL2 through the contact plug 32C.

In the wring layer of the same level, the dummy word line DWL1 is connected to a connection electrode 30D of an L shape. An extraction electrode 31D extending in the X-direction is connected to at least one layer of the connection electrode 30D among eight layers of the connection electrode 30D. In the present embodiment, for example, the extraction electrode 31D is extracted from the connection electrode 30D of the lowermost layer. A contact plug 32D is provided on the extraction electrode 31D. That is, voltage control is possible for only one layer among eight layers of the dummy word line DWL1 through the contact plug 32D.

For example, the width of the dummy word line DWL2 disposed at the end is greater than the width of the dummy word line DWL0. For example, the width of the dummy word line DWL1 is the same as the width of the dummy word line DWL0. The width of the dummy word line DWL1 may be different from the width of the dummy word line DWL0.

As described above, in the present embodiment, the contact plug is connected to only one layer among the eight stacked dummy word lines DWL. Therefore, it is possible to reduce the area of the hookup region in the dummy cell array DA. Since the remaining seven dummy word lines DWL are electrically connected to each other through the bit line BL and the variable resistance layer, the voltage control is possible.

Here, considering connecting the contact plug to all of the dummy word lines that are stacked similarly to the word lines, a region where the contact plugs as many as the memory blocks MB are disposed is necessary. Therefore, in the dummy cell array DA, the dummy word lines DWL as many as the word lines WL in the memory block MB should be disposed. Generally, since only about several dummy word lines DWL are necessary, unnecessary region is formed, which causes an increase of a chip size.

[1-6] Another configuration of hookup region

In the above-described configuration example of the hookup region, the contact plug is connected to the dummy word line of the lowermost layer in both of the hookup region HU1 and the hookup region HU2. The contact plug may be connected to the dummy word line of different layers in the hookup region HU1 and the hookup region HU2.

Figure 13:
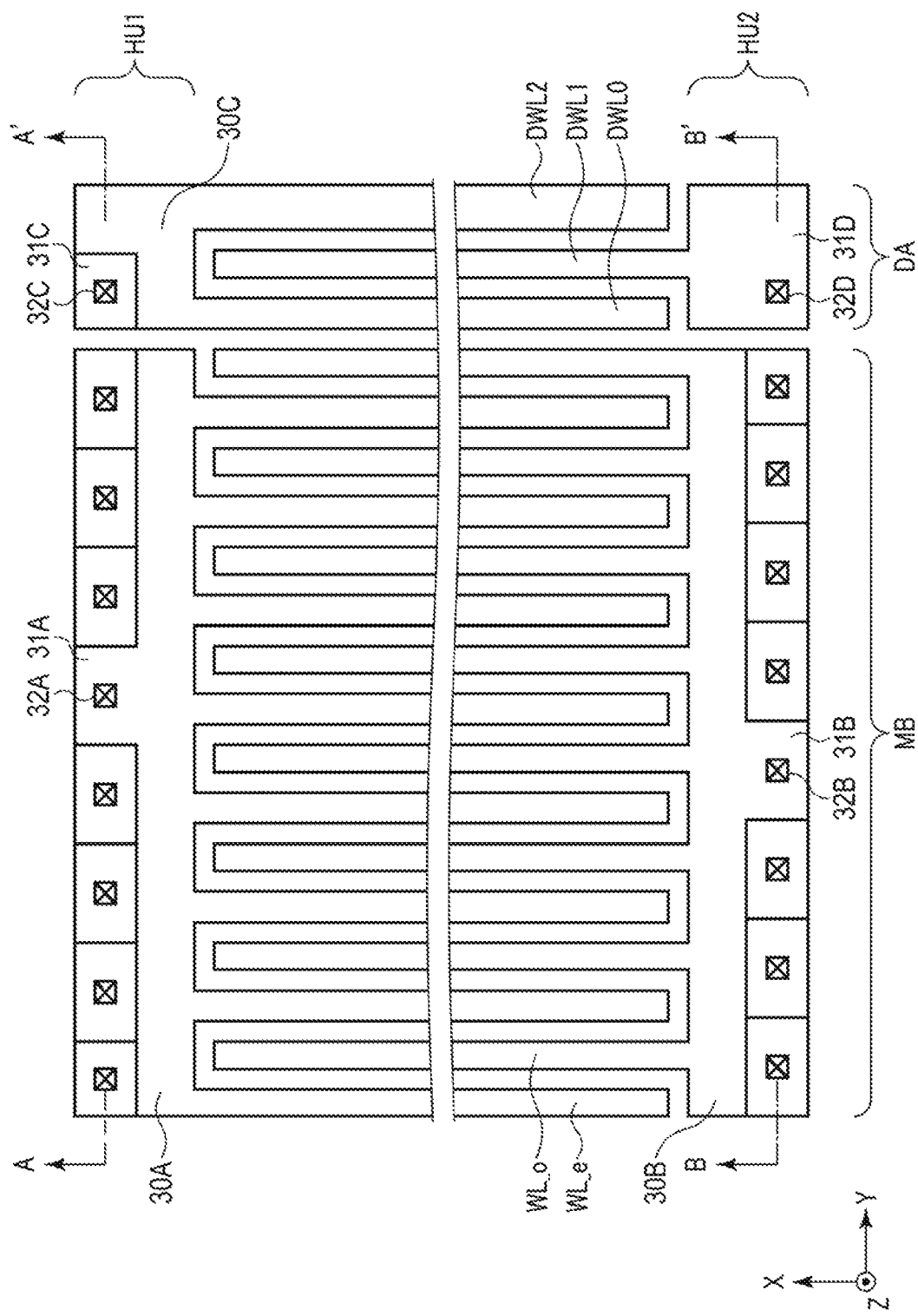
FIG. 13 is a plan view illustrating another configuration of the hookup regions.
Figure 14:
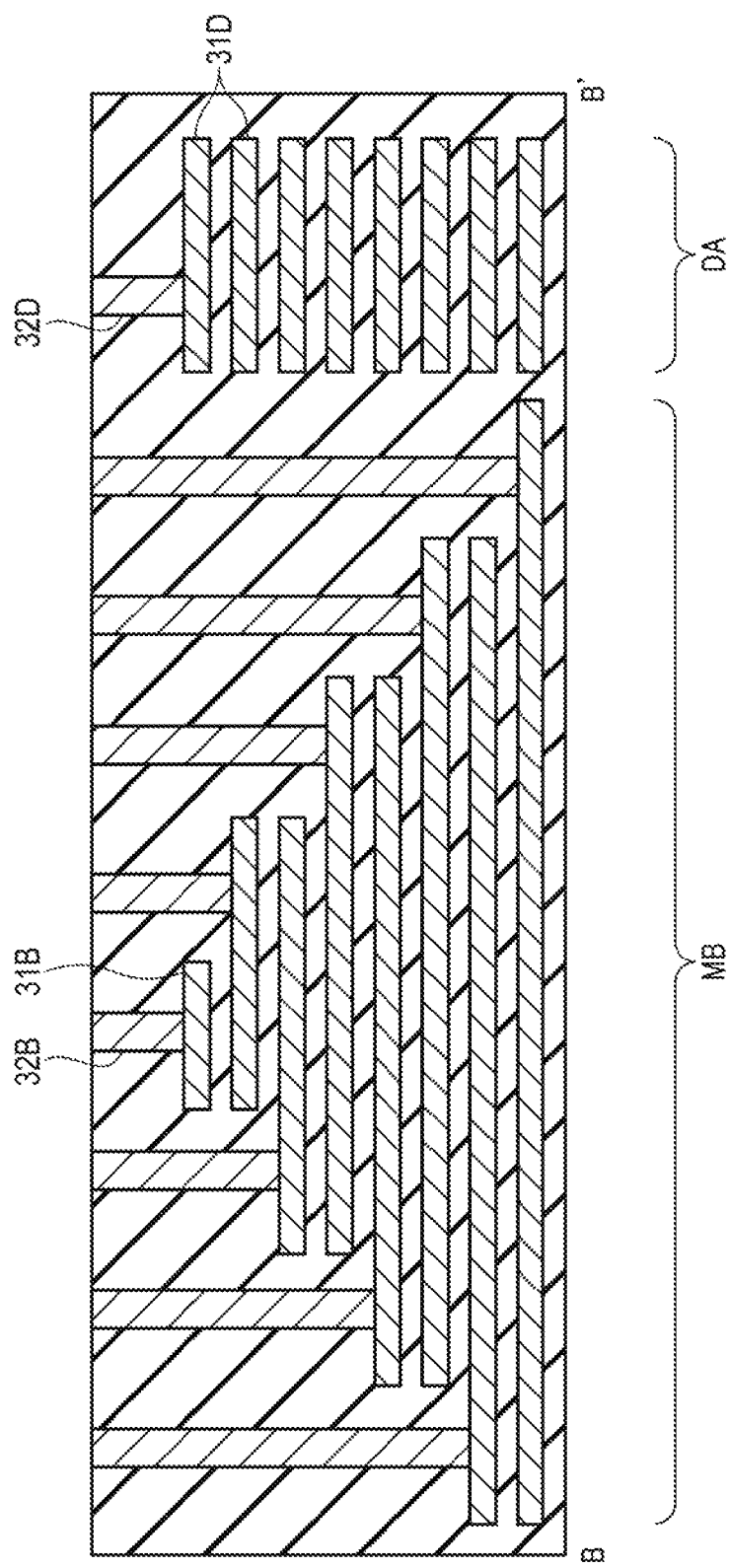
FIG. 14 is a cross-sectional view of the hookup region taken along a line B-B' of FIG. 13.

FIG. 13 is a plan view illustrating another configuration of the hookup region HU1 and the hookup region HU2. FIG. 14 is a cross-sectional view of the hookup region HU2 taken along a line B-B' of FIG. 13. A cross-sectional view taken along a line A-A' of FIG. 13 is the same as FIG. 11.

The dummy word line DWL1 of eight layers is connected to the extraction electrode 31D. A contact plug 32D is provided on the extraction electrode 31D. That is, the voltage control is possible through the contact plug 32D for the dummy word line DWL1 of the uppermost layer among the eight layers of the dummy word line DWL1.

In addition, the contact plug 32D may be connected to the dummy word line DWL1 other than the uppermost layer.

[2] Operation

Next, the operation of the semiconductor storage device 10 configured as described above will be described.

[2-1] Basic Operation

The memory cell MC may store data of one bit and stores data according to its own resistance state. An operation of setting the memory cell MC to the high resistance state (that is, an operation of transiting from the low resistance state to the high resistance state) is referred to as a reset operation and an operation of setting the memory cell MC to the low resistance state (that is, an operation of transiting from the high resistance state to the low resistance state) is referred to as a set operation.

Figure 15:
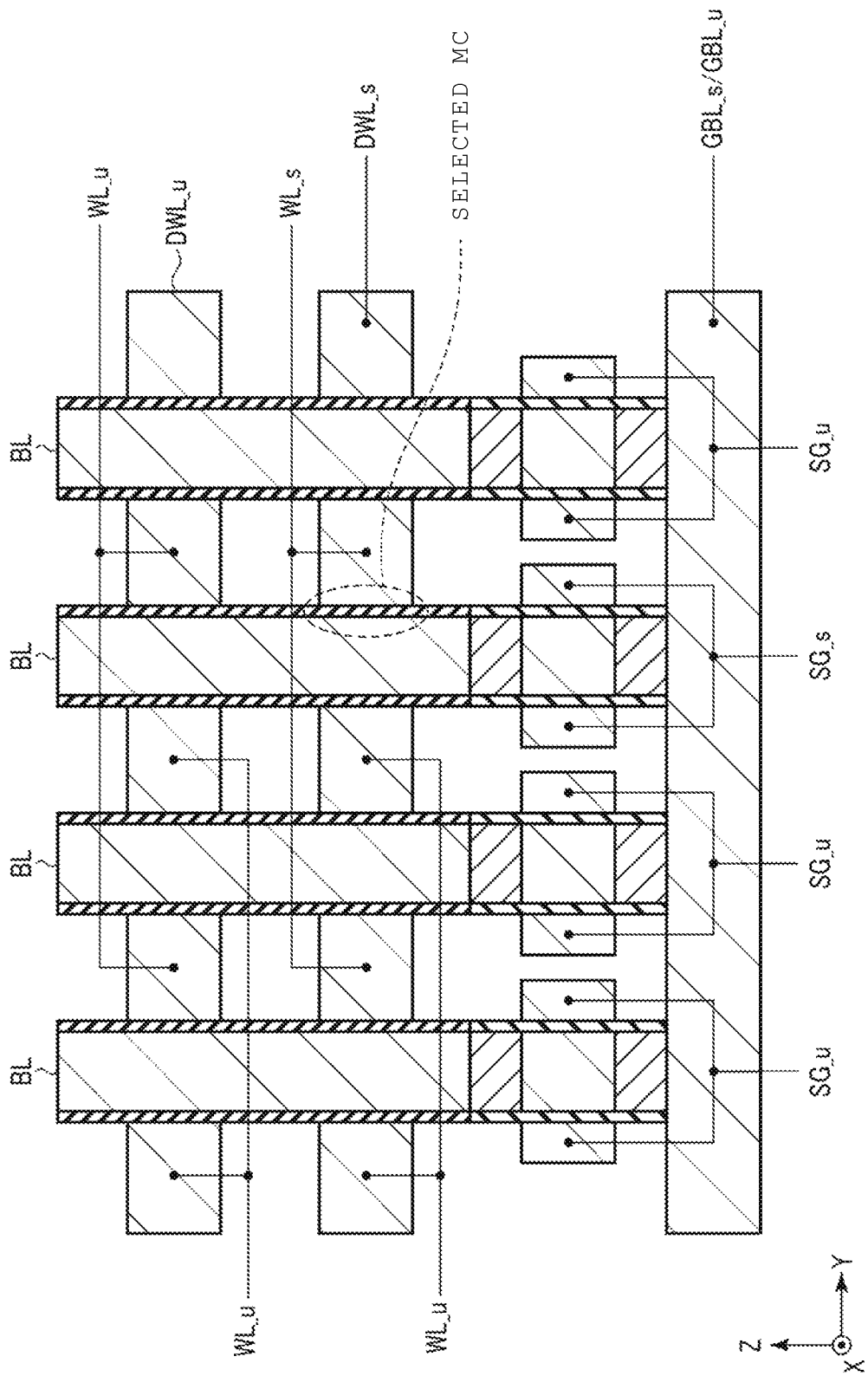
FIG. 15 is a schematic cross-sectional view of the memory cell array for describing a reset operation, a set operation, and a read operation.

FIG. 15 is a schematic cross-sectional view of the memory cell array 11 for describing the reset operation, the set operation, and the read operation. FIG. 16 is a diagram for describing voltages of the reset operation, the set operation, and the read operation. A selected global bit line is denoted as "GBL_s", a non-selected global bit line is denoted as "GBL_u", a selected word line is denoted as "WL_s", a non-selected word line is denoted as "WL_u", a selected select gate line is denoted as "SG_s", and a non-selected select gate line is denoted as "SG_u". Hereinafter, the reset operation, the set operation, and the read operation are sequentially described.

Reset Operation

When the data is stored in the memory cell MC in the reset operation, the control circuit 17 applies a reset voltage Vw (>0 V) to the selected global bit line GBL_s, and applies a voltage Vwf (=Vw/2) to the non-selected global bit line GBL_u and the non-selected word line WL_u so that a voltage applied to a half-selected cell is a half of a voltage applied to a selected cell. In addition, the control circuit 17 applies 0 V to the selected word line WL_s and the non-selected select gate line SG_u and applies a reset gate voltage Vg_w (>0 V) to the selected select gate line SG_s. The reset gate voltage Vg_w is a voltage for turning on the select transistor ST in the reset operation.

As a result, the select transistor ST connected to the selected bit line BL is turned on and the reset voltage Vw is transferred from the selected global bit line GBL_s to the selected memory cell MC. On the other hand, 0 V is transferred from the selected word line WL_s to the selected memory cell MC. As described, a potential difference of Vw is given to both ends of the variable resistance element, and thus a resistance state of the memory cell MC becomes the high resistance state. As a result, the data of the memory cell MC is reset.

Set Operation

When the data is stored in the memory cell MC in the set operation, in consideration of a bipolar operation of the memory cell MC, the control circuit 17 applies a voltage Ve (>0 V) to the selected word line WL_s, and applies a voltage Vef (=Ve/2) to the non-selected global bit line GBL_u and the non-selected word line WL_u so that the voltage applied to the half-selected cell is half of the voltage applied to the selected cell. In addition, the control circuit 17 applies 0 V to the selected global bit line GBL_s and the non-selected select gate line SG_u and applies a set gate voltage Vg_e to the selected select gate line SG_s. The set gate voltage Vg_e is a voltage for turning on the select transistor ST in the set operation.

As a result, the select transistor ST connected to the selected bit line BL is turned on and the set voltage Ve is transferred from the selected word line WL_s to the selected memory cell MC. On the other hand, 0 V is transferred from the selected global bit line GBL_s to the selected memory cell MC. As described, a potential difference of Ve is given to the both ends of the variable resistance element, and thus the resistance state of the memory cell MC becomes the low resistance state. As a result, the data of the memory cell MC is set.

Read Operation

At the time of the read operation for reading the data of the memory cell MC, the control circuit 17 applies a read voltage Vr to the selected global bit line GBL_s and the non-selected global bit line GBL_u. In addition, the control circuit 17 applies 0 V to the selected word line WL_s and applies the read voltage Vr to the non-selected word line WL_u. In addition, the control circuit 17 applies a read gate voltage Vg r to the selected select gate line SG_s and applies 0 V to the non-selected select gate line SG_u. The read gate voltage Vg r is a voltage for turning on the select transistor ST in the read operation.

As a result, the select transistor ST connected to the selected bit line BL is turned on and the read voltage Vr is transferred from the selected global bit line GBL_s to the selected memory cell MC. On the other hand, 0 V is transferred from the selected word line WL_s to the selected memory cell MC. Here, a current flowing through the selected memory cell MC is different by the resistance state of the selected memory cell MC. In addition, the sense amplifier 15 detects a current flowing through the selected global bit line GBL_s, and thus the data stored in the selected memory cell MC is determined.

[2-2] Voltage Control of Dummy Word Line DWL

Next, the voltage control of the dummy word line DWL will be described. In the present embodiment, as an example, the contact plug 32C is connected to the dummy word line DWL of the lowermost layer, and the voltage control of the dummy word line DWL of the lowermost layer is possible using the contact plug 32C. As illustrated in FIG. 15, the dummy word line of the lowermost layer of which the voltage control is possible is denoted as "DWL_s". The dummy word line other than the dummy word line of the lowermost layer, that is, the dummy word line not connected to the contact plug, is denoted as "DWL_u". FIG. 16 also illustrates a voltage of the dummy word line DWL_s.

The control circuit 17 applies a non-selected word line voltage VUX to the dummy word line DWL_s. The non-selected word line voltage VUX is the same as the voltage applied to the non-selected word line WL_u in the reset operation, the set operation, and the read operation. Specifically, as illustrated in FIG. 16, (1) in the reset operation, VUX=Vwf, (2) in the set operation, VUX=Vef, and (3) in the read operation, VUX=Vr.

A variable resistance layer between the dummy word line DWL and the bit line BL functions as a resistance component. That is, the dummy word line DWL and the bit line BL are electrically connected with each other. Therefore, the voltage VUX applied to the dummy word line DWL_s is also transferred to the dummy word line DWL_u. Finally, it is possible to set all of the dummy word lines DWL to an approximate voltage VUX.

In addition, the non-selected word line voltage VUX may be set to a fixed voltage regardless of the reset operation, the set operation, and the read operation.

[3] Effect of embodiment

As described above in detail, in the present embodiment, the memory cell array 11 includes the dummy cell array DA adjacent to the memory block MB. The dummy cell array DA has the same three-dimensional stacked structure as that of the memory block MB and includes the plurality of dummy word lines DWL. The contact plug 32C is connected to, for example, one dummy word line DWL among the plurality of stacked dummy word lines DWL through the extraction electrode 31C. On the other hand, a contact plug is not connected to other dummy word lines. In addition, the control circuit 17 applies the non-selected word line voltage VUX that is the same voltage as that of the non-selected word line to the contact plug 32C.

Therefore, according to the present embodiment, it is possible to reduce the hookup region for applying the voltage to the dummy word line DWL. Thus, it is possible to reduce the chip area.

In addition, the plurality of dummy word lines DWL is electrically connected with each other through the dummy cell DC that is the resistance component. Therefore, for example, it is possible to set all of the dummy word lines DWL to the approximate voltage VUX by applying the voltage VUX to one layer of the dummy word line DWL.

In addition, it is possible to set the voltage of the dummy word line DWL to be the same as the voltage of the non-selected word line WL_u. Therefore, it is possible to reduce malfunction of the memory cell MC adjacent to the dummy word line DWL.

In addition, the number of the dummy word lines connected to the contact plug among the stacked dummy word lines DWL is not limited to one and may be any number less than the number of the stacked word lines.

In addition, in two adjacent dummy word line groups, the layer of the dummy word line to which the contact plug is connected may be different.

In addition, the three-dimensional structure is not limited to the above-described embodiment. For example, a hole penetrating the plurality of stacked word lines WL may be formed through the plurality of stacked word lines WL, and the bit line BL of a column shape and a variable resistance layer surrounding a side surface of the bit line BL may be formed in the hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor storage device comprising:
   a global bit line that extends in a first horizontal direction;
   a first select transistor provided on the global bit line and including a first terminal connected to the global bit line;
   a first bit line provided on the first select transistor, extending in a vertical direction, and connected to a second terminal of the first select transistor;
   a plurality of word lines and insulating layers that are stacked alternately in a vertical direction;
   a first variable resistance layer between one of the plurality of word lines and a first side surface of the first bit line;
   a plurality of first dummy word lines and insulating layers that are stacked alternately in the vertical direction and disposed at the same level as the plurality of word lines; and
   a second variable resistance layer provided between one of the plurality of first dummy word lines and a second side surface opposite to the first side surface of the first bit line.

2. The semiconductor storage device according to claim 1, further comprising:
   a first extraction electrode connected to the one of the plurality of first dummy word lines in a second horizontal direction intersecting with the first horizontal direction; and
   a first contact plug that is connected to the first extraction electrode and extends in the vertical direction.

3. The semiconductor storage device according to claim 1, further comprising:
   a second select transistor provided on the global bit line and including a first terminal connected to the global bit line;
   a second bit line provided on the second select transistor so as to extend in the vertical direction and connected to a second terminal of the second select transistor;
   a third variable resistance layer between one of the plurality of first dummy word lines and a first side surface of the second bit line;
   a plurality of second dummy word lines and insulating layers that are stacked alternately in the vertical direction and disposed at the same level as the plurality of first dummy word lines; and
   a fourth variable resistance layer between one of the plurality of second dummy word lines and a second side surface opposite to the first side surface of the second bit line.

4. The semiconductor storage device according to claim 3, further comprising:

a first extraction electrode connected to the one of the plurality of first dummy word lines in a second horizontal direction intersecting with the first horizontal direction;

a first contact plug connected to the first extraction electrode and extending in the vertical direction;

a second extraction electrode connected to the of the plurality of second dummy word lines in a third horizontal direction opposite to the second horizontal direction; and a second contact plug connected to the second extraction electrode and extending in the vertical direction.

5. The semiconductor storage device according to claim 3, wherein
a width of the second dummy word line is different from a width of the first dummy word line.

6. The semiconductor storage device according to claim 3, further comprising:
a third select transistor provided on the global bit line and including a first terminal connected to the global bit line;
a third bit line provided on the third select transistor, extending in the vertical direction, and connected to a second terminal of the third select transistor;
a fifth variable resistance layer between one of the plurality of second dummy word lines and a first side surface of the third bit line;
a plurality of third dummy word lines and insulating layers that are stacked alternately in the vertical direction and disposed at the same level as the plurality of first dummy word lines; and
a sixth variable resistance layer between one of the plurality of third dummy word lines and a second side surface opposite to the first side surface of the third bit line.

7. The semiconductor storage device according to claim 6, wherein
a width of the third dummy word line is different from a width of the first dummy word line.

8. The semiconductor storage device according to claim 6, further comprising:
a plurality of connection electrodes connecting each of the plurality of first dummy word lines with each of the plurality of third dummy word lines.

9. The semiconductor storage device according to claim 1, further comprising:
a control circuit configured to apply a first voltage to at least one of the plurality of first dummy word lines.

10. The semiconductor storage device according to claim 9, wherein
the first voltage is the same as a voltage applied to a non-selected word line.

11. The semiconductor storage device according to claim 9, wherein
the first voltage varies for each of a reset operation, a set operation, and a read operation.

12. A semiconductor storage device comprising:
a global bit line that extends in a first horizontal direction;
a first select transistor provided on the global bit line and including a first terminal connected to the global bit line;
a first bit line provided on the first select transistor, extending in a vertical direction, and connected to a second terminal of the first select transistor;
a plurality of word lines and insulating layers that are stacked alternately in a vertical direction;
a first variable resistance layer between one of the plurality of word lines and a first side surface of the first bit line;
a plurality of first dummy word lines and insulating layers that are stacked alternately in the vertical direction and disposed at the same level as the plurality of word lines; and
a second variable resistance layer between one of the plurality of first dummy word lines and a second side surface opposite to the first side surface of the first bit line,
wherein one of the plurality of dummy word lines is electrically connected to a ground voltage.

13. The semiconductor storage device according to claim 12, further comprising:
a first extraction electrode connected to one of the plurality of first dummy word lines in a second horizontal direction intersecting with the first horizontal direction; and
a first contact plug that is connected to the first extraction electrode and extends in the vertical direction.

14. The semiconductor storage device according to claim 12, further comprising:
a second select transistor provided on the global bit line and including a first terminal connected to the global bit line;
a second bit line provided on the second select transistor, extending in the vertical direction, and connected to a second terminal of the second select transistor;
a third variable resistance layer between the one of the plurality of first dummy word lines and a first side surface of the second bit line;
a plurality of second dummy word lines and insulating layers that are stacked alternately in the vertical direction and disposed at the same level as the plurality of first dummy word lines; and
a fourth variable resistance layer between one of the plurality of second dummy word lines and a second side surface opposite to the first side surface of the second bit line.

15. The semiconductor storage device according to claim 14, further comprising:
a first extraction electrode connected to one of the plurality of first dummy word lines in a second horizontal direction intersecting with the first horizontal direction;
a first contact plug connected to the first extraction electrode and extending in the vertical direction;
a second extraction electrode connected to one of the plurality of second dummy word lines in a third horizontal direction opposite to the second horizontal direction; and
a second contact plug connected to the second extraction electrode and extending in the vertical direction.

16. The semiconductor storage device according to claim 14, wherein
a width of the second dummy word line is different from a width of the first dummy word line.

17. The semiconductor storage device according to claim 14, further comprising:
a third select transistor provided on the global bit line and having a first terminal connected to the global bit line;
a third bit line provided on the third select transistor, extending in the vertical direction, and connected to a second terminal of the third select transistor;
a fifth variable resistance layer between one of the plurality of second dummy word lines and a first side surface of the third bit line;

a plurality of third dummy word lines and insulating layers that are stacked alternately in the vertical direction and disposed at the same level as the plurality of first dummy word lines; and a sixth variable resistance layer between one of the plurality of third dummy word lines and a second side surface opposite to the first side surface of the third bit line.

18. The semiconductor storage device according to claim 17, wherein a width of the third dummy word line is different from a width of the first dummy word line.

19. The semiconductor storage device according to claim 17, further comprising:

a plurality of connection electrodes connecting each of the plurality of first dummy word lines with each of the plurality of third dummy word lines.

20. The semiconductor storage device according to claim 12, further comprising:

a control circuit that configured to apply the ground voltage to at least one of the plurality of first dummy word lines.

* * * * *